(12) United States Patent
Park

(10) Patent No.: US 11,121,011 B2
(45) Date of Patent: Sep. 14, 2021

(54) PROCESS SYSTEM AND OPERATION METHOD THEREOF

(71) Applicant: SAMSUNG ELECTRONICS CO., LTD., Suwon-si (KR)

(72) Inventor: Sang-moo Park, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/401,880

(22) Filed: May 2, 2019

(65) Prior Publication Data

US 2019/0259642 A1 Aug. 22, 2019

Related U.S. Application Data

(63) Continuation of application No. 15/258,572, filed on Sep. 7, 2016, now Pat. No. 10,319,617.

(30) Foreign Application Priority Data

Apr. 26, 2016 (KR) ........................ 10-2016-0050737

(51) Int. Cl.
*H01L 21/67* (2006.01)
*H01L 23/00* (2006.01)
(Continued)

(52) U.S. Cl.
CPC .. *H01L 21/67132* (2013.01); *H01L 21/67144* (2013.01); *H01L 24/95* (2013.01);
(Continued)

(58) Field of Classification Search
CPC ....... G02F 1/1335; B32B 37/12; H01L 29/24; H01L 33/00; H01L 24/27; H01L 24/97;
(Continued)

(56) References Cited

U.S. PATENT DOCUMENTS 6,514,790 B1 2/2003 Plettner et al.
6,660,557 B2 12/2003 Usami
(Continued)

FOREIGN PATENT DOCUMENTS

JP 10-70142 A 3/1998
JP 2001-283169 A 10/2001
(Continued)

OTHER PUBLICATIONS

International Search Report dated Dec. 14, 2016 issued by the International Searching Authority in counterpart International Patent Application No. PCT/KR2016/010813 (PCT/ISA/210).
(Continued)

*Primary Examiner* — Ronald P Jarrett
(74) *Attorney, Agent, or Firm* — Sughrue Mion, PLLC

(57) ABSTRACT

A process system includes a substrate, first wafers, second wafers, and a roller. The first wafers are arranged at predetermined intervals along a first column which is parallel to an edge of the substrate, wherein each of the first wafers includes first chips. The second wafers are arranged at the predetermined intervals and at an offset from the first wafers, along a second column which is parallel to the first column, wherein each of the second wafers includes second chips. The roller is configured to roll in a first direction to pick up the plurality of first chips, roll in a second direction opposite to the first direction while suspended from the first wafers, pick up the second chips included in the wafers by rolling in the first direction, and transport the first chips and the second chips to the substrate.

11 Claims, 14 Drawing Sheets

(51) Int. Cl.
*H01L 33/00* (2010.01)
*H01L 25/075* (2006.01)

(52) U.S. Cl.
CPC ...... *H01L 33/0095* (2013.01); *H01L 25/0753* (2013.01); *H01L 2924/14* (2013.01)

(58) Field of Classification Search
CPC ......... H01L 21/75161; H01L 21/76161; H01L 21/77161; H01L 21/79161; H01L 21/67144
USPC .......................................... 438/106, 107, 118
See application file for complete search history.

(56) References Cited

U.S. PATENT DOCUMENTS

| | | | |
|---|---|---|---|
| 7,056,769 | B2 | 6/2006 | Usami |
| 7,459,341 | B2 | 12/2008 | Usami |
| 7,820,481 | B2 | 10/2010 | Cote et al. |
| 9,117,940 | B2 | 8/2015 | Rogers et al. |
| 9,331,230 | B2 | 5/2016 | Shieh et al. |
| 10,461,058 | B2 * | 10/2019 | Kitazawa ............... H01L 24/743 |
| 2002/0016020 | A1 | 2/2002 | Usami |
| 2004/0063243 | A1 | 4/2004 | Usami |
| 2006/0189040 | A1 | 8/2006 | Usami |
| 2007/0020801 | A1 * | 1/2007 | Ishikawa .......... G06K 19/07718 438/106 |
| 2008/0121724 | A1 | 5/2008 | Beer et al. |
| 2008/0230372 | A1 | 9/2008 | Cousins et al. |
| 2009/0199960 | A1 | 8/2009 | Nuzzo et al. |
| 2009/0269882 | A1 | 10/2009 | Cote et al. |
| 2010/0236053 | A1 | 9/2010 | Nakamura et al. |
| 2011/0275171 | A1 | 11/2011 | Chen |
| 2014/0120640 | A1 | 5/2014 | Shieh et al. |

FOREIGN PATENT DOCUMENTS

| | | | | |
|---|---|---|---|---|
| JP | 2009-130157 | A | 6/2009 | |
| JP | 2010-62270 | * | 3/2010 | ........... H01L 21/683 |
| KR | 10-0880812 | B1 | 1/2009 | |
| KR | 10-2009-0093147 | A | 9/2009 | |
| KR | 10-2015-0082414 | A | 7/2015 | |
| WO | 2005/099310 | A2 | 10/2005 | |

OTHER PUBLICATIONS

Written Opinion dated Dec. 14, 2016 issued by the International Searching Authority in counterpart International Patent Application No. PCT/KR2016/010813 (PCT/ISA/237).

* cited by examiner

PROCESS SYSTEM AND OPERATION METHOD THEREOF

CROSS-REFERENCE TO RELATED APPLICATIONS

This application is a continuation of U.S. application Ser. No. 15/258,572, filed Sep. 7, 2016, which claims priority from Korean Patent Application No. 10-2016-0050737, filed in the Korean Intellectual Property Office on Apr. 26, 2016, the disclosure of which is incorporated herein by reference in its entirety.

BACKGROUND

1. Field

Systems and methods consistent with exemplary embodiments relate to a process system and an operation method thereof, and more particularly, to a process system which moves chips from a wafer and an operation method thereof.

2. Description of the Related Art

Owing to the development of electronic technology, various devices and products are developed and distributed, and with the advancement in data processing and semiconductor integration technologies, high-resolution displays are widely used in homes.

In order to implement a high-resolution display, chips of red (R), green (G) and blue (B) that compose each pixel need to be moved from a wafer. For example, a modern ultra-high definition (UHD) display has a resolution of 3840×2160, and when considering that each of these pixels requires three chips (RGB), 24,883,200 (3×3840×2160) individual chips are needed. Thus, there exists a need for an efficient way to transport a large quantity of chips from at least three different types of wafers (e.g., R, G, and B) to a target substrate.

A conventional carrier is merely able to pick up chips from one wafer and move the chips to the substrate. In other words, the carrier is limited to performing the operation only for one wafer at a time. In addition, as the resolution of displays becomes higher, manufacturing time cannot be further reduced with the existing technology.

Accordingly, there is a need for a method for picking up multiple chips from multiple wafers and moving the chips to a target substrate.

SUMMARY

Exemplary embodiments are related to a process system for picking up chips from a plurality of wafers and transporting the chips to a substrate and an operation method thereof.

According to an aspect of an exemplary embodiment, a process system includes a substrate, a plurality of first wafers, a plurality of second wafers, and a roller, The plurality of first wafers are arranged at predetermined intervals along a first column which is parallel to an edge of the substrate. Each of the plurality of first wafers includes a plurality of first chips. The plurality of second wafers are arranged at the predetermined intervals and at an offset from the plurality of first wafers, along a second column which is parallel to the first column. Each of the plurality of second wafers includes a plurality of second chips. The roller is configured to roll in a first direction to pick up the plurality of first chips included in the plurality of first wafers, roll in a second direction opposite to the first direction while the roller is suspended from the plurality of first wafers, pick up the plurality of second chips included in the plurality of second wafers by rolling in the first direction, and transport the plurality of first chips and the plurality of second chips to the substrate.

According to an aspect of another exemplary embodiment, an operation method includes arranging a plurality of first wafers, respectively including a plurality of first chips, at predetermined intervals along a first column which is parallel to an edge of a substrate; arranging a plurality of second wafers, respectively including a plurality of second chips, at the predetermined intervals and at an offset from the plurality of first wafers, along a second column which is parallel to the first column; picking up the plurality of first chips included in the plurality of first wafers by using a roller which rolls in a first direction from an initial position of the roller towards the substrate; rolling the roller in a second direction opposite to the first direction, towards the initial position of the roller, while the roller is suspended from the plurality of first wafers; picking up the plurality of second chips included in the plurality of second wafers by using the roller which rolls in the first direction towards the substrate; and transporting, by the roller, the plurality of first chips and the plurality of second chips to the substrate.

According to an aspect of yet another exemplary embodiment, a method includes positioning a roller at a first position on a rolling surface, the roller having a cylindrical shape and a rotational axis that is parallel to an edge of a substrate located, on the rolling surface, at a predetermined distance away from the first position; rolling the roller along the rotational axis across the rolling surface from the first position to a second position between the first position and the substrate while the roller rotates in a first direction, and picking up a plurality of first chips from a first wafer, located at the first position on the rolling surface, by adhering the plurality of first chips to a curved surface of the roller; lifting the roller up from the rolling surface; rotating the roller along the rotational axis in a second direction opposite of the first direction; dropping the roller onto the rolling surface; rolling the roller along the rotational axis across the rolling surface from the second position to a third position between the second position and the substrate while the roller rotates in the first direction, and picking up a plurality of second chips from a second wafer, located at the second position on the rolling surface, by adhering the plurality of second chips to the curved surface of the roller; and rolling the roller along the rotational axis across the rolling surface from the third position to the substrate, and depositing the plurality of first chips and the plurality of second chips on the substrate.

According to the various exemplary embodiments, because a plurality of chips may be picked up from a plurality of wafers and the plurality of chips may be moved to a substrate, the manufacturing time may be reduced.

BRIEF DESCRIPTION OF THE DRAWINGS

The above and/or other aspects will be more apparent by describing certain exemplary embodiments with reference to the accompanying drawings, in which.

DETAILED DESCRIPTION OF THE EXEMPLARY EMBODIMENTS

Figure 1:
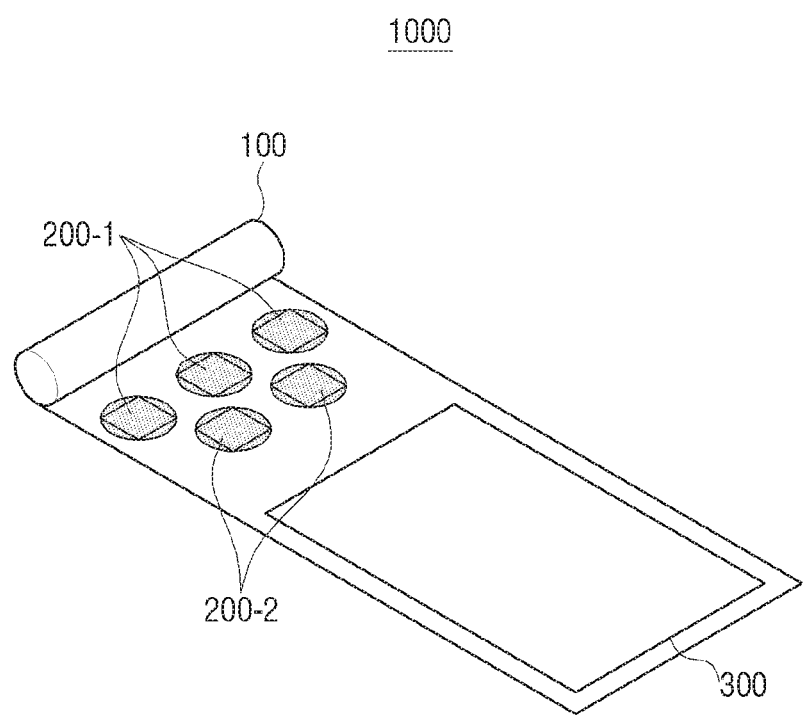
FIG. 1 is a view illustrating a process system according to an exemplary embodiment.

The exemplary embodiments of the present disclosure may be diversely modified. Accordingly, specific exemplary embodiments are illustrated in the drawings and are described in detail in the detailed description. However, it is to be understood that the present disclosure is not limited to a specific exemplary embodiment, but includes all modifications, equivalents, and substitutions without departing from the scope and spirit of the present disclosure. Also, well-known functions or constructions are not described in detail since they would obscure the disclosure with unnecessary detail.

Hereinafter, exemplary embodiments will be described in detail with reference to the accompanying drawings. This is not intended to limit the exemplary embodiments, but includes all modifications, equivalents, and alternatives without departing from the scope and spirit of the exemplary embodiments. Also, with regard to numerals of drawings, like reference numerals in the drawings denote like elements.

Also, it should be understood that a description described as one element (for example, a first element) being operatively or communicatively coupled or connected to another element (for example, a second element) includes all cases such as each of the elements directly being connected to each other and the elements being indirectly connected through another element (for example, a third element). However, if it is described that an element (for example, a first element) is "directly coupled to" or "directly connected to" another element (for example, a second element), the description may be understood as there is no another element (for example, a third element) between the element (the first element) and the other element (the second element).

Terms used in the disclosure are used to explain any exemplary embodiments, and the terms are not to limit the scope of other exemplary embodiments. Also, in the specification, for a convenience for an explanation, a singular expression may be used but unless specified otherwise in the context, the singular expression includes a plural expression. The terms used in the disclosure may have identical meanings that are commonly understood by people having common knowledge in a field of the disclosure. Among the terms used in the disclosure, general terms that are lexically defined may be interpreted as or similar to meanings that are interpreted in the technical contexts, and unless clearly defined in the disclosure, the terms should not be interpreted as ideal meanings or excessively formal meanings. In some cases, even some terms defined in the disclosure cannot be interpreted to exclude the exemplary embodiments.

Hereinafter, the exemplary embodiments will be described in detail with reference to the accompanying drawings.

FIG. 1 is a view illustrating a process system 1000 according to an exemplary embodiment. As illustrated in FIG. 1, the process system 1000 includes a roller 100 and wafers 200-1, 200-2, and a substrate 300.

The roller 100 may be embodied as a cylinder shape. The horizontal cylinder shape or the roller 100 may roll on the substrate 300 by passing over top surfaces of wafers 200-1, 200-2. Here, the roller 100, wafers 200-1, 200-2, and the substrate 300 may be located on an identical flat surface. The length of the roller 100 may be identical or longer than the length of an edge of the substrate 300. The rolling direction of the roller 100 may be in parallel to a pair of edges of the substrate 300 which are in parallel to each other.

The roller 100 may pick up chips included in wafers 200-1, 200-2 and move the chips to the substrate 300. For example, the roller 100 may be embodied by an adhesive material and may pick up chips included in the wafers by rolling on the wafers 200-1, 200-2.

Specifically, the roller 100 may pick up chips from a plurality of wafers 200-1, 200-2. For example, when a plurality of wafers are arranged on a column, the roller 100 may simultaneously pick up chips from the plurality of wafers to the extent that the length allows.

The roller 100 may move the picked-up chips to the substrate 300 by rolling on the substrate 300 in a condition that the chips are picked up. For example, adhesiveness of the substrate 300 may be stronger than adhesiveness of the roller 100, and accordingly, the chips picked up by the roller 100 may be moved to the substrate 300.

The roller 100 may partially pick up chips included in the wafers 200-1, 200-2. For example, the roller 100 may pick up chips at predetermined intervals among a plurality of chips included in the wafers 200-1, 200-2.

Hereinabove, the explanation is based on the limitation that the roller 100 is embodied by an adhesive material, but this is only an exemplary embodiment. For example, the roller 100 may pick up chips and move the chips to the substrate 300 by using an electrostatic force.

The wafers 200-1, 200-2 may include a plurality of chips, also known as dies. For example, each of the wafers 200-1, 200-2 may include a plurality of chips in an m×n matrix. The chips may be, for example, integrated circuits (ICs) or microchips.

The wafers 200-1, 200-2 may be arranged at predetermined intervals along a first column that is in parallel to an edge of the substrate 300, and may include the plurality of first wafers 200-1 that respectively include a plurality of chips and the plurality of second wafers 200-2 which are arranged at an offset from the plurality of first wafers 200-1 at the predetermined intervals along a second column which is in parallel to the first column and respectively include a plurality of chips. However, the disclosure is not limited thereto. The plurality of first wafers 200-1 may be arranged along the second column and the plurality of second wafers 200-2 may be arranged along the first column.

The plurality of first wafers 200-1 and the plurality of second wafers 200-2 may be an identical kind of wafers. Accordingly, the number of chips included in the plurality of first wafers 200-1 may be identical to the number of chips included in the plurality of first wafers 200-2.

The plurality of first wafers 200-1 and the plurality of second wafers 200-2 may be arranged in an identical direction. For example, each of the plurality of first wafers 200-1 and the plurality of second wafers 200-2 may respectively include a plurality of chips in an m×n matrix, and the plurality of chips in the m×n matrix may form a rectangular area in one wafer. The plurality of first wafers 200-1 and the plurality of second wafers 200-2 may be arranged in order for a pair of edges which are in parallel to each other among edges of the rectangular area to be in parallel to the roller's rolling direction and the other pair of edges which are in parallel to each other to be vertical to the rolling direction of the roller 100.

The plurality of first wafers 200-1 and the plurality of second wafers 200-2 may be consecutively located between the roller 100 and the substrate 300. In other words, the plurality of first wafers 200-1 and the plurality of second wafers 200-2 may be located in the roller's rolling direction and may touch the roller 100 before touching the substrate 300.

The substrate 300 may be a substrate in a rectangular shape including a plurality of chips. For example, the substrate 300 may be a liquid crystal display (LCD) panel including a plurality of pixels, and each pixel may include chips of red (R), green (G) and blue (B). In other words, in case of an LCD panel of full high-definition (FHD) resolution, the panel includes 1920×1080 pixels and thus requires 3×1920×1080 chips.

The substrate 300 may be located at a rolling direction of the roller 100. According to an exemplary embodiment, the roller 100, the wafers 200-1, 200-2 and the substrate 300 may be consecutively disposed in order for the roller 100 to move chips picked up from the wafers 200-1, 200-2 to the substrate 300.

The substrate 300 may be provided with needed chips from the roller 100. Specifically, when the substrate 300 is big, many chips may be needed, or various kinds of chips may be needed, the roller 100 may move chips to the substrate 300 many times.

As described above, when generating the substrate 300 that includes a plurality of chips, manufacturing process time may be reduced by picking up chips from a plurality of wafers.

Hereinafter, the process system 1000 is explained in more detail with reference to FIGS. 2 to 12.

Figure 2:
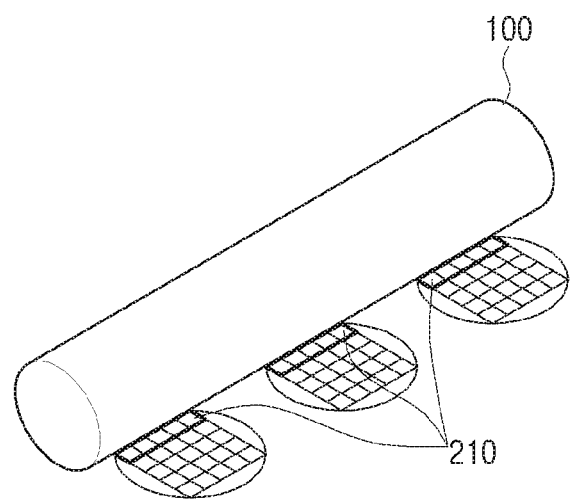
FIG. 2 is a view illustrating a method of a roller picking up chips according to an exemplary embodiment.

FIG. 2 is a view illustrating a method of the roller 100 picking up chips according to an exemplary embodiment.

First of all, the roller 100 may pick up a plurality of chips included in the plurality of first wafers 200-1 by rolling in a predetermined direction. Herein, the roller 100 may be embodied as a cylinder shape whose length is predetermined along a pivot direction. A pivot is an axis around which the roller 100 rotates to roll on the plurality of first wafers 200-1 and the substrate 300. In other words, the pivot runs perpendicular to the direction in which the roller 100, wafers 200-1, 200-2 and the substrate 300 are consecutively aligned.

While rolling in the direction in which the substrate 300 is disposed, the roller 100 may simultaneously pick up a plurality of chips 210 that come in contact with the roller 100 among the plurality of chips included in the plurality of first wafers 200-1 arranged on a column along the pivot direction. In FIG. 2, it is illustrated that the plurality of chips 210 touching the roller 100 are in one column, but the disclosure is not limited thereto. For example, if the roller 100 is sufficiently big or the chips are sufficiently small, the plurality of chips 210 touching the roller 100 may be on a plurality of columns.

The roller 100 may pick up a plurality of chips included in the plurality of second wafers 200-2 in a substantially similar method.

Figure 3:
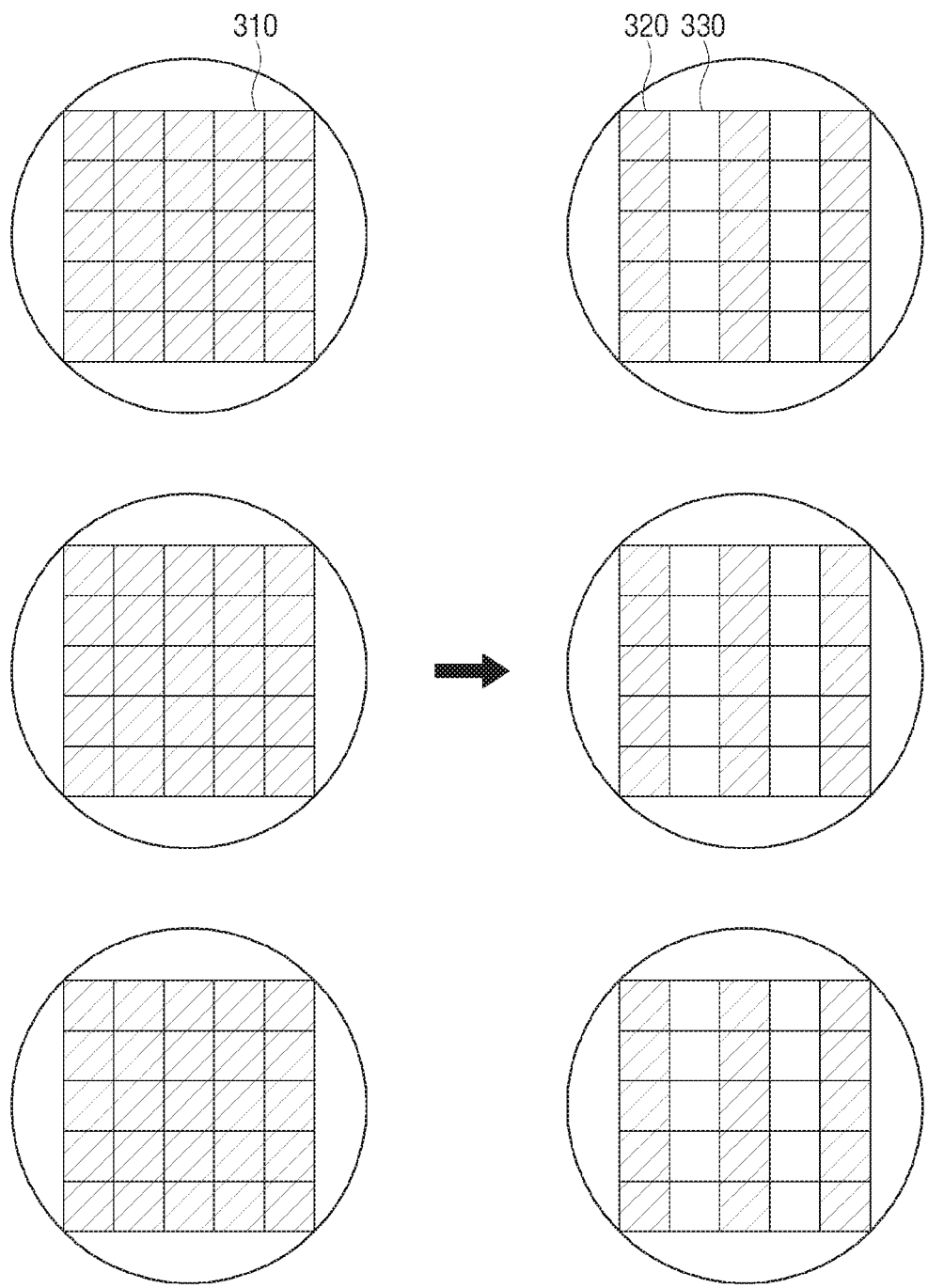
FIG. 3 is a view illustrating a method of a roller picking up chips by rolling in more detail according to an exemplary embodiment.

FIG. 3 is a view illustrating a method of the roller 100 picking up chips by rolling in more detail according to an exemplary embodiment.

Each of the plurality of first wafers 200-1 may include a plurality of chips in an m×n matrix. In FIG. 3, it is illustrated that wafers include a plurality of chips 310 in a 5×5 matrix for a convenience of the explanation, but it only pertains to an exemplary embodiment.

The roller 100 may simultaneously pick up a plurality of chips disposed on a column which is spaced apart as much as a first interval in a rolling direction by rolling in the direction in which the substrate 300 is disposed. For example, the roller 100 may not pick up chips on a first column 320 but pick up chips on a second column 330 from a wafer including the plurality of chips 310 in the 5×5 matrix form.

The roller 100 may pick up chips on the other columns according to the method of skipping the chips on the first column 320 but picking up the chips on the second column 330. However, the disclosure is not limited thereto and chips may be picked up at different intervals. For example, the roller 100 may pick up chips on the first column 320, skip the next two columns and pick up chips on the fourth column.

When generating an LCD panel including a plurality of pixels through such a method, the operation may be performed with regard to only one type of chips pertaining to R, G and B of each pixel. For example, by picking up chips from a wafer including chips pertaining to R and moving the chips to a substrate, the substrate on which chips pertaining to R at a first interval may be generated. If all chips pertaining to R are disposed on the substrate, chips pertaining to G or B may be moved to the substrate by switching to a different kind of a wafer. Herein, the chips pertaining to G or B may be disposed near the chips pertaining to R.

Such a pick-up method may be applied to other wafers that are arranged at predetermined intervals along an identical column. Also, the roller 100 may pick up a plurality of chips included in the plurality of second wafers 200-2 in the identical method.

Figure 4:
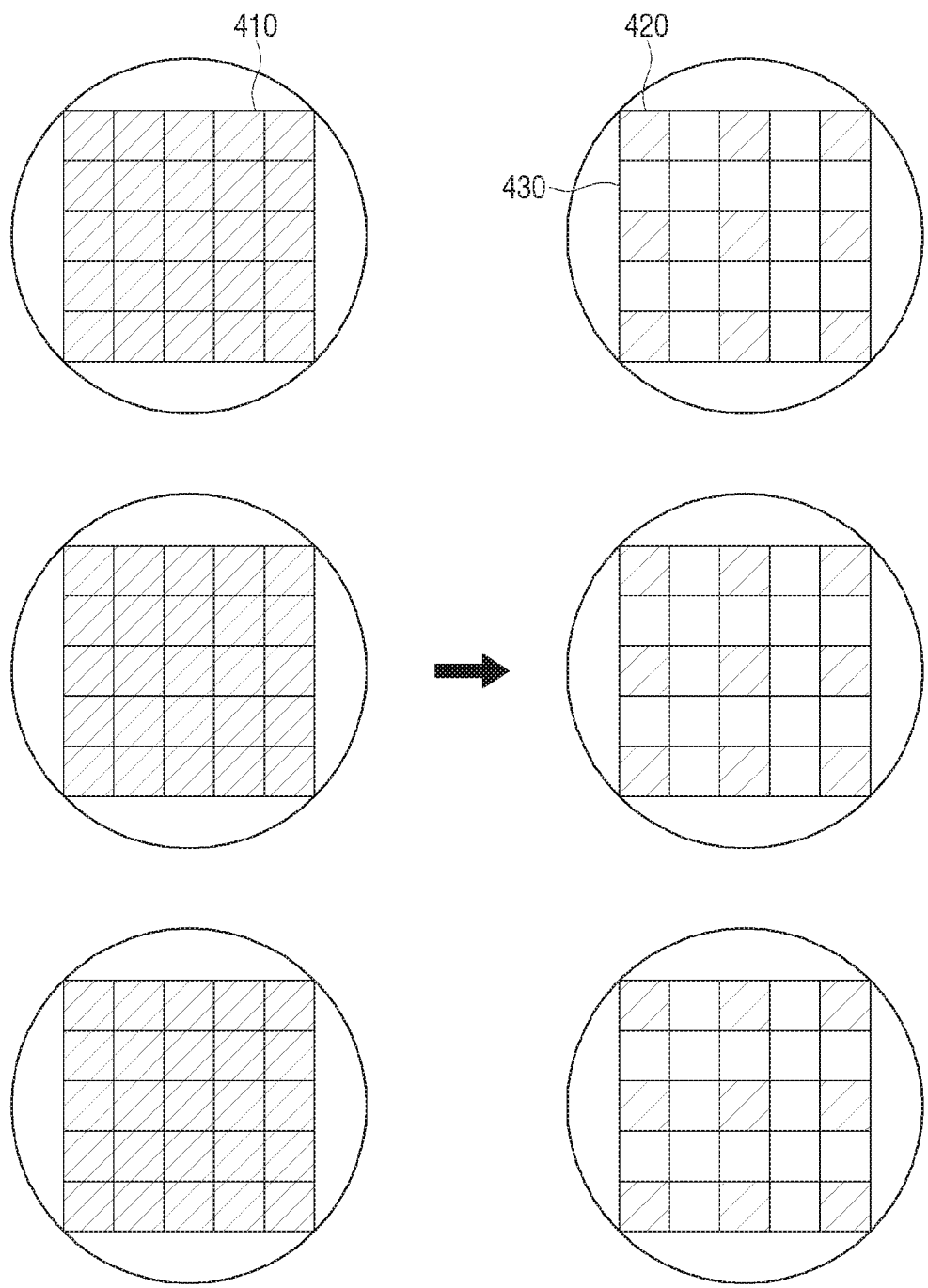
FIG. 4 is a view illustrating a roller picking up chips by rolling in more detail according to another exemplary embodiment.

FIG. 4 is a view illustrating the roller 100 picking up chips by rolling in more detail according to another exemplary embodiment.

While rolling in a direction in which the substrate 300 is disposed, the roller 100 may simultaneously pick up chips which are spaced apart at second intervals among a plurality of chips disposed in the same column. For example, the roller 100 may not pick up a chip on a first row 420 but may pick up a chip only on a second row 430 on a first column of a wafer including a plurality of chips 410 in a 5×5 matrix.

The roller 100 may pick up chips at identical intervals with regard to the other chips on the first column. In FIG. 4, it is illustrated that the chips are picked up at intervals of one chip on the first column, but the disclosure is not limited thereto. For example, the roller 100 may pick up a chip on the first row 420, skip two rows and pick up a chip on a fourth row on the first column; and, in this way, the roller 100 may pick up chips located on the other columns.

The roller 100 may simultaneously pick up chips that are spaced apart at second intervals among a plurality of chips disposed on a column spaced apart as much as the first interval in a rolling direction. Herein, the first interval indicates a space between a column from which chips are picked up and the next column from which chips are picked up, and the second interval indicates a space between a row from which chips are picked up and the next row from which chips are not picked up. Thus, the first interval may coincide with the columns from which chips are not picked up, and the second interval may coincide with the rows from which chips are not picked up. Because a method for picking up chips at first intervals with regard to a column has been described above, further explanation on the method will be omitted.

Such a pick-up method may be applied to a different wafer arranged at a predetermined interval along an identical column. Also, the roller 100 may pick up a plurality of chips included in the plurality of second wafers 200-2 in the identical method.

In FIGS. 3 and 4, the explanations are based on rules that are applied to picking up chips, but the disclosure is not limited thereto. For example, according to a kind of the substrate 300, the roller 100 may pick up chips at irregular intervals.

Figure 5:
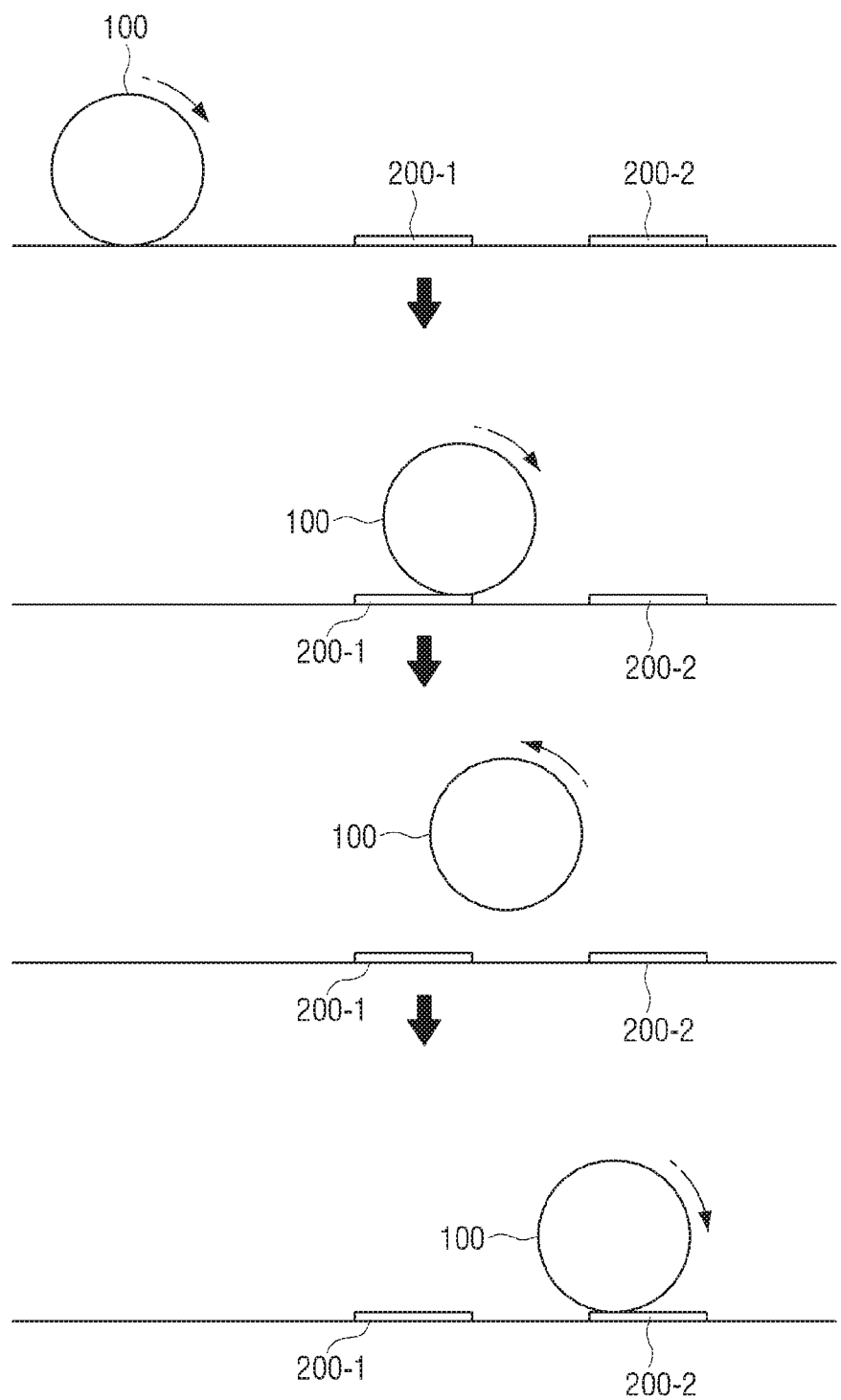
FIG. 5 is a view illustrating rolling of a roller according to an exemplary embodiment.

FIG. 5 is a view illustrating rolling of the roller 100 according to an exemplary embodiment.

As illustrated in FIG. 5, while rolling in a predetermined direction, the roller 100 may pick up a plurality of chips included in the plurality of first wafers 200-1. Herein, the roller 100, as explained with reference to FIGS. 3 and 4, may pick up chips at predetermined intervals with regard to rows or columns.

The roller 100 may pick up a plurality of chips included in the plurality of first wafers 200-1 and roll in a reverse direction of the predetermined direction while being pulled away and apart from the plurality of first wafers 200-1. This is done in order to pick up chips from the plurality of first wafers 200-1 and chips from the plurality of second wafers 200-2 on predetermined areas of a surface of the roller 100. Detailed description will later follow.

In addition, the roller 100 may pick up a plurality of chips included in the plurality of second wafers 200-2 by rolling in the predetermined direction again to transport the plurality of chips to the substrate 300. Herein, the method of the roller 100 picking up the plurality of chips included in the second wafer 200-2 may be identical to a method of the roller 100 picking up a plurality of chips included in the first wafer 200-1. For example, the roller 100 may pick up chips located on other columns through the method of picking up all chips located on an identical column, skipping two columns and picking up all chips located on the very next column; and such a method may be identically applied to the plurality of first wafers 200-1 and the plurality of second wafers 200-2.

However, the disclosure is not limited thereto, and according to a type of the substrate 300, chips may be picked up at irregular intervals. For example, according to a type of the substrate 300, the roller 100 may pick up all chips included in the plurality of first wafers 200-1 but may pick up only some of the chips included in the plurality of second wafers 200-2.

Meanwhile, the roller 100 may transport the chips picked up from the plurality of first wafers 200-1 and the plurality of second wafers 200-2 to the substrate 300 by rolling in a predetermined direction.

After moving the chips to the substrate 300, the roller 100 may repeat the operation illustrated in FIG. 5. Herein, the plurality of first wafers 200-1 and the plurality of second wafers 200-2 may be replaced with new wafers that include an identical type with chips (e.g., wafers including a plurality of chips pertaining to R). Alternatively, the plurality of first wafer 200-1 and the plurality of second wafer 200-2 may be replaced with new wafers with different types of chips (e.g., wafers including a plurality of chips pertaining to B or G).

Figure 6:
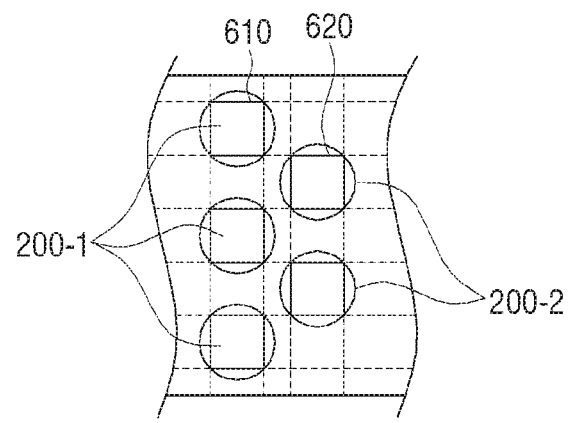
FIG. 6 is a view illustrating a method of disposing a plurality of first wafers and a plurality of second wafers according to an exemplary embodiment.

FIG. 6 is a view illustrating a method of disposing the plurality of first wafers 200-1 and the plurality of second wafers 200-2 according to an exemplary embodiment.

As illustrated in FIG. 6, the plurality of first wafers 200-1 may be arranged at predetermined intervals along a first column that is in parallel to an edge of the substrate 300. The plurality of second wafers 200-2 may be arranged to at an offset from the plurality of first wafer 200-1 at the predetermined intervals along a second column that is in parallel to the first column.

Herein, the plurality of first wafers 200-1 and the plurality of second wafers 200-2 may be an identical kind of wafers, and each wafer may include a plurality of chips in an m×n matrix.

Each wafer may be arranged in an identical direction. For example, a plurality of chips in the m×n matrix form may form a rectangular area in one wafer. The plurality of first wafers 200-1 and the plurality of second wafers 200-2 may be arranged along a pair of edges that are in parallel to each other among edges of the rectangular area to be in parallel to a rolling direction of the roller 100 and the other pair of edges that are in parallel to each other to be perpendicular to the rolling direction of the roller 100.

The first column and the second column may be spaced apart at a predetermined distance. For example, in order for the plurality of first wafers 200-1 arranged at predetermined intervals along the first column and the plurality of second wafers 200-2 arranged at the predetermined intervals along the second column not to overlap, the first column and the second column may be spaced apart. Therefore, the first column and the second column may be spaced apart based on a size of a wafer.

As illustrated in FIG. 6, a plurality of wafers may be arranged such that the parallel edges a rectangular areas of each wafer belonging in the same column are all aligned to the same virtual parallel lines.

Meanwhile, the predetermined intervals between the wafers may be determined based on a size of an area that includes a plurality of chips included in one wafer. For example, the plurality of first wafers 200-1 and the plurality of second wafers 200-2 may be arranged in order for an area including chips that are picked up by a surface of the roller 100 from the plurality of first wafers 200-1 and the plurality of second wafers 200-2 to form a rectangular shape. In other words, the plurality of first wafers 200-1 and the plurality of second wafers 200-2 may be arranged such that the edges of an area having a plurality of chips for each wafer may be placed along dotted lines illustrated in FIG. 6.

In this case, the roller 100 may pick up chips in order for the chips picked up from the plurality of first wafers 200-1 and the plurality of second wafers 200-2 to form rectangular shapes by picking up chips from the plurality of first wafers 200-1, rolling in the opposite direction while the roller 100 is pulled away from the plurality of first wafers 200-1, and then picking up chips from the plurality of second wafers 200-2.

It is illustrated in FIG. 6 that the plurality of first wafers 200-1 have three wafers including a wafer 610 and the plurality of second wafers 200-2 have two wafers including a wafer 620, but the disclosure is not limited thereto. Wafers can be arranged in any different numbers. Specifically, according to a size of a substrate, the first column the second column may include, for example, only one wafer each.

Additionally, the plurality of first wafers 200-1 may be arranged along the second column and the plurality of second wafers 200-2 may be arranged along the first column.

Figure 7:
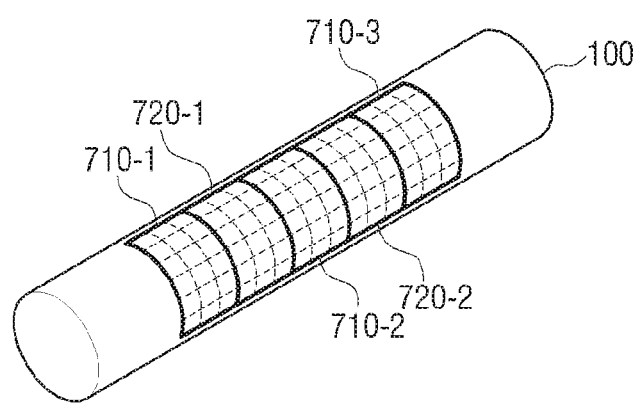
FIG. 7 is a view illustrating areas including picked-up chips according to an exemplary embodiment.

FIG. 7 is a view illustrating areas including picked-up chips according to an exemplary embodiment.

As illustrated in FIG. 7, in order for a plurality of chips included in the plurality of second wafers 200-2 to be picked up in spaces between a plurality of chips picked up from the plurality of first wafers 200-1, the roller 100 may roll in a direction opposite to the predetermined direction while the roller 100 is pulled away from the plurality of first wafers 200-1. In other words, the roller 100 may be lifted up from the rolling surface on which the plurality of first wafers 200-1 are disposed and then rotated in a reverse direction.

Because the roller 100 rolls in the direction opposite to the predetermined direction in the picking up process, the picked-up chips may be arranged on the surface of the roller 100 in a rectangular shape. In addition, the distance between the chips adhering to the pick-up area of the roller 100 may be arranged at regular intervals from each other.

Specifically, the roller 100 may form first areas 710-1, 710-2, 710-3 by picking up chips from the plurality of first wafers 200-1 and form second areas 720-1, 720-2 by picking up chips from the plurality of second wafers 200-2. The first areas 710-1, 710-2, 710-3 and the second areas 720-1, 720-2 may each form rectangular shapes.

Additionally, in a case where chips from the plurality of first wafers 200-1 and the plurality of second wafers 200-2 are picked up at the first and second intervals as described above, areas including all of the picked-up chips may be rectangular in shape. Herein, a distance between adjacent chips within the pick-up areas may be a little larger.

However, the disclosure is not limited thereto and according to the substrate 300, chips may be picked up in various shapes.

Figure 8:
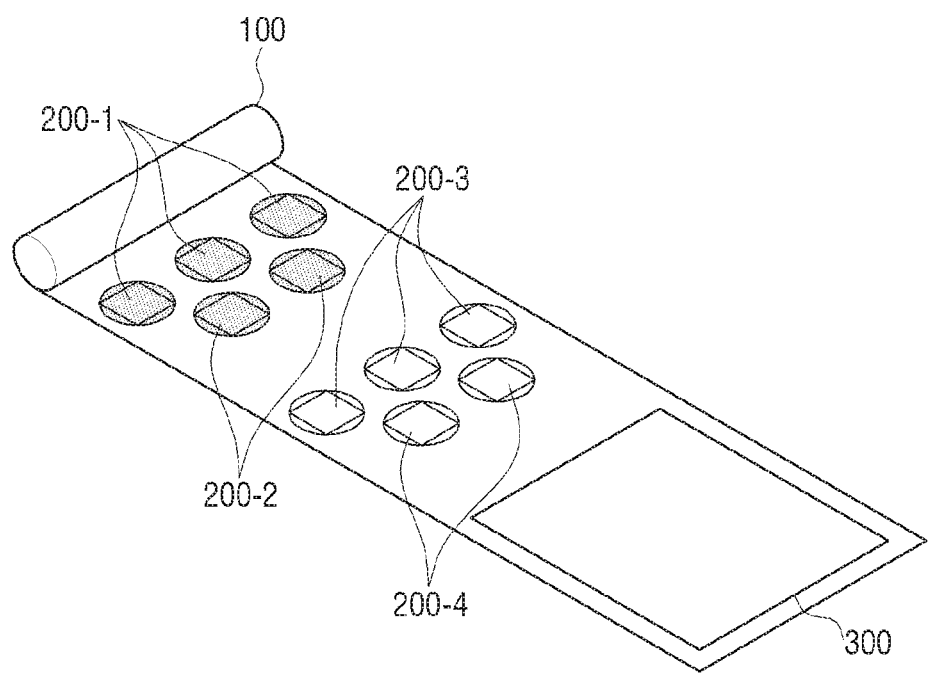
FIG. 8 is a view illustrating a method of picking up different types of wafers according to an exemplary embodiment.

FIG. 8 is a view illustrating a method of picking up different types of wafers according to an exemplary embodiment.

As illustrated in FIG. 8, the process system 1000 may further include a plurality of third wafers 200-3 that are arranged at the predetermined intervals along a third column that is in parallel to the first column and respectively including a plurality of chips. The process system 1000 may further still include a plurality of fourth wafers 200-4 that are arranged to at an offset from the plurality of third wafers 200-3 at the predetermined intervals along a fourth column that is in parallel to the first column and including a plurality of chips.

In other words, the plurality of third wafers 200-3 and the plurality of fourth wafers 200-4 may be respectively arranged with the same method by which the plurality of first wafers 200-1 and the plurality of second wafers 200-2 are arranged.

Additionally, the plurality of third wafers 200-3 and the plurality of fourth wafers 200-4 may be an identical kind of wafers.

However, the plurality of third wafers 200-3 and the plurality of fourth wafers 200-4 may be of a different kind of wafers from the plurality of first wafers 200-1 and the plurality of second wafers 200-2. For example, the plurality of first wafers 200-1 and the plurality of second wafers 200-2 may be wafers of chips pertaining to R, while the plurality of third wafers 200-3 and the plurality of fourth wafers 200-4 may be wafers of chips pertaining to G or B.

The roller 100 may pick up some of a plurality of chips included in the plurality of third wafers 200-3 and the plurality of fourth wafers 200-4 between a plurality of chips picked up at the first and second intervals. In other words, in the same method of picking up chips at the first and second intervals which are described with the plurality of first wafers 200-1 and the plurality of second wafers 200-2, the roller 100 may pick up chips included in the plurality of third wafers 200-3 and the plurality of fourth wafers 200-4.

However, the chips may be picked up at different locations on a surface of the roller 100. For example, each of the plurality of chips picked up from the plurality of third wafers 200-3 and the plurality of fourth wafers 200-4 may be adjacent to each of the plurality of chips picked up from the plurality of first wafers 200-1 and the plurality of second wafers 200-2.

Although FIG. 8 describes the use of the plurality of first wafers 200-1, the plurality of second wafers 200-2, the plurality of third wafers 200-3, and the plurality of fourth wafers 200-4, the disclosure is not limited thereto. For example, the process system 100 may further include a plurality of fifth wafers, a plurality of sixth wafers, and so forth.

The plurality of fifth wafers and the plurality of sixth wafers may be an identical kind of wafers but different from the kind of wafers in the plurality of first wafers 200-1 and the plurality of second wafers 200-2 and different still from the kind of wafers of the plurality of third wafers 200-3 and the plurality of fourth wafers 200-4. For example, the plurality of first wafers 200-1 and the plurality of second wafers 200-2 may be wafers of chips pertaining to R; the plurality of third wafers 200-3 and the plurality of fourth wafers 200-4 may be wafers of chips pertaining to G; and the plurality of fifth wafers and the plurality of sixth wafers may be wafers of chips pertaining to B. In this case, the roller 100 may pick up all chips pertaining to R, G and B and transport all of the picked-up chips to the substrate 300.

Figure 9:
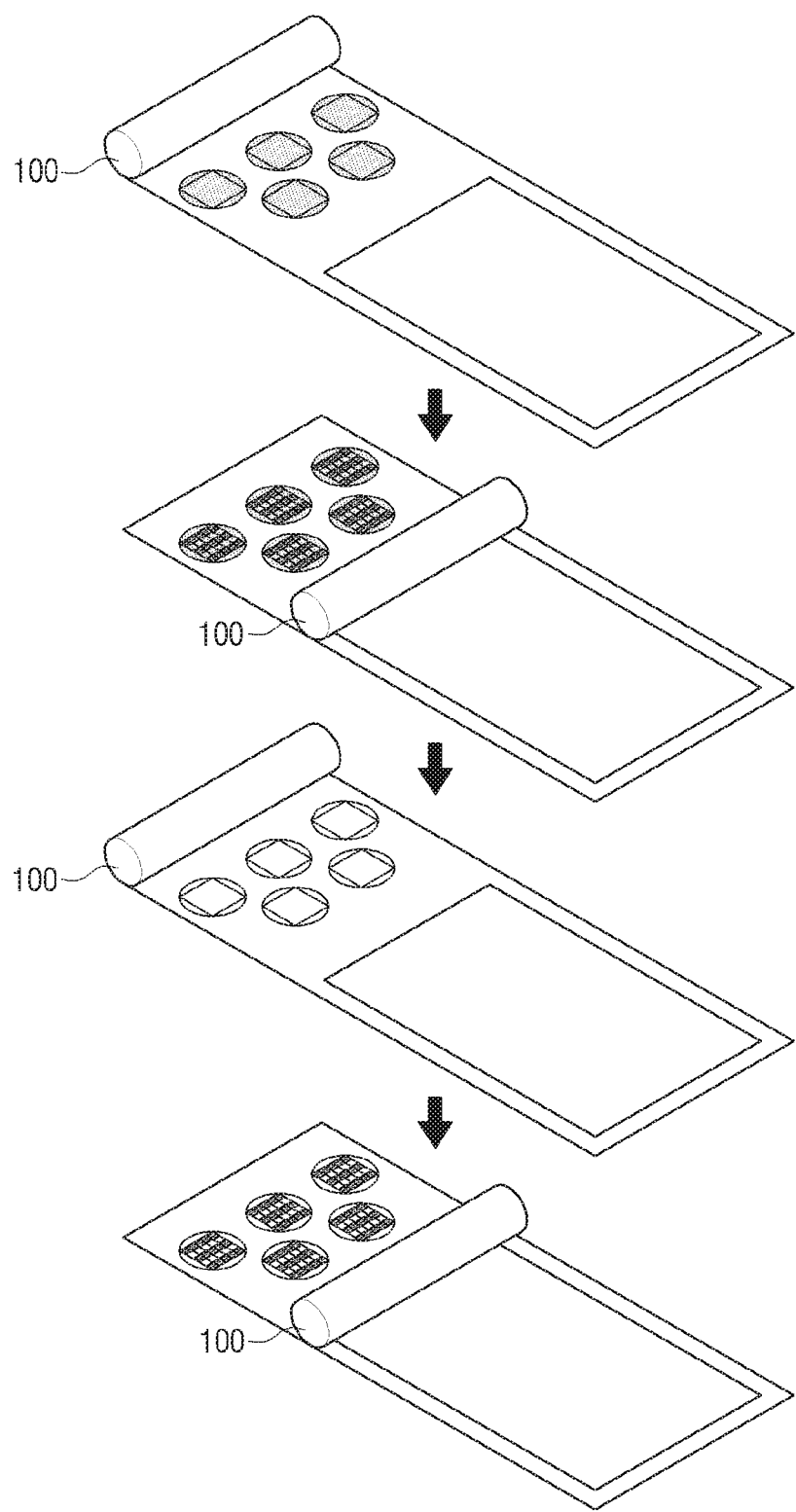
FIG. 9 is a view illustrating a method of picking up different types of wafers according to another exemplary embodiment.

FIG. 9 is a view illustrating a method of picking up different types of wafers according to another exemplary embodiment.

As illustrated in FIG. 9, after picking up a plurality of chips from the plurality of first wafers 200-1 and the plurality of second wafers 200-2, when a different type of wafers are located on the places where the plurality of first wafers 200-1 and the plurality of second wafers 200-2 were (i.e., the plurality of first wafers 200-1 and the plurality of second wafers 200-2 are a mixture of two or more different types of wafer), the roller 100 may move as much as a predetermined distance along an axis and pick up a plurality of chips of a different type of wafers by repeating the same process.

The method illustrated in FIG. 9 is similar to the method illustrated in FIG. 8 but has an advantage of taking up a smaller space. In other words, instead of providing two columns of wafers (i.e., the plurality of first wafers 200-1 and the plurality of second wafers 200-2) of one type and two more columns of wafers (i.e., the plurality of third wafers 200-3 and the plurality of fourth wafers 200-4) of another type, only two columns of wafers having two different types may be provided. However, because it takes time for the roller 100 to move back to the original position, the method illustrated in FIG. 9 may require an increased process time.

The roller 100 may pick up a plurality of chips included in a different type of wafer in spaces between a plurality of chips picked up from the plurality of first wafers 200-1 and the plurality of second wafers 200-2 by moving a predetermined distance along an axis. However, the disclosure is not limited thereto, and the roller 100 may change a pick-up location of a surface of the roller 100 by using an electrostatic force. In this case, the roller 100 does not need to move the predetermined distance along the axis.

Although it is illustrated in FIG. 9 that chips are picked up from two kinds of wafers; the disclosure is not limited thereto. For example, the roller 100 may pick up chips from the plurality of first wafers 200-1 and the plurality of second wafers 200-2 including chips pertaining to R, pick up chips from a plurality of wafers including chips pertaining to G, and then pick up chips from a plurality of wafers including chips pertaining to B. In this case, the roller 100 may pick up all chips pertaining to R, G, and B and transport all of the chips to the substrate 300.

Figure 10:
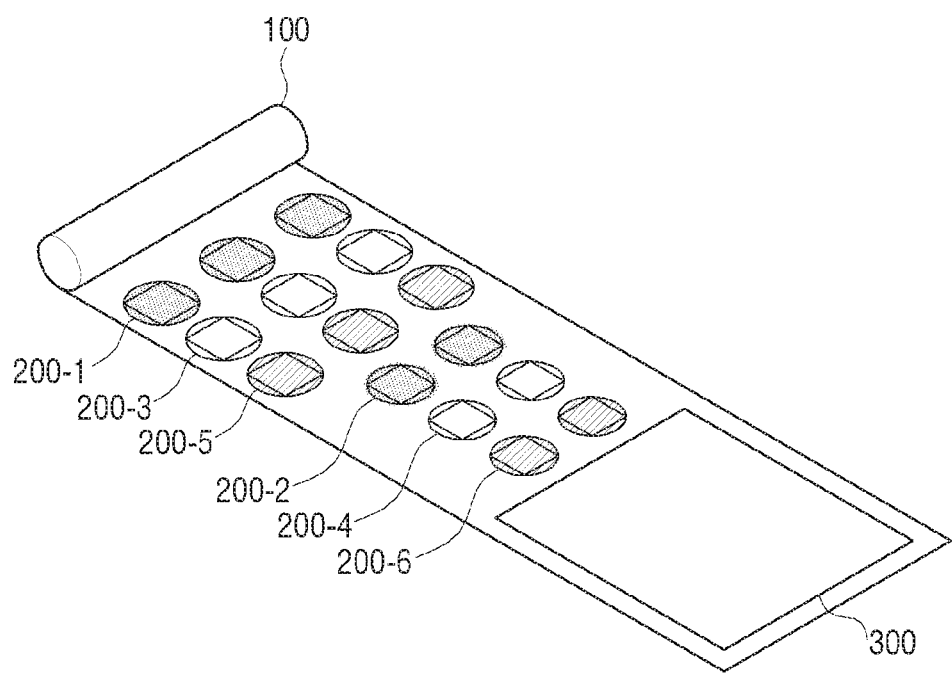
FIG. 10 is a view illustrating a method of picking up different types of wafers according to another exemplary embodiment.

FIG. 10 is a view illustrating a method of picking up different types of wafers according to another exemplary embodiment.

As illustrated in FIG. 10, the plurality of first wafers 200-1, the plurality of third wafers 200-3, a plurality of fifth wafers 200-5, the plurality of second wafers 200-2, the plurality of fourth wafers 200-4, and a plurality of sixth wafers 200-6 may be consecutively disposed.

Herein, for example, the plurality of first wafers 200-1 and the plurality of second wafers 200-2 may be wafers including chips pertaining to R; the plurality of third wafers 200-3 and the plurality of fourth wafers 200-4 may be wafers including chips pertaining to G; and the plurality of fifth wafers 200-5 and the plurality of sixth wafers 200-6 may be wafers including chips pertaining to B. However, this only pertains to an exemplary embodiment and a disposing order may be changed.

The roller 100 may pick up a plurality of chips included in the plurality of first wafers 200-1 by rolling in a predetermined direction, and after rolling in a direction opposite to the predetermined direction while being pulled away from the plurality of first wafers 200-1, the roller 100 may pick up a plurality of chips included in the plurality of third wafers 200-3 by rolling again in the predetermined direction. The roller 100 may pick up chips from the rest of the plurality of wafers in the same method, and transport the picked-up chips onto the substrate 300.

Herein, the roller 100 may pick up chips at the first and second intervals, a further description of which is omitted to avoid repetition.

The roller 100 may pick up a plurality of chips by rolling in the predetermined direction, and transport the picked-up chips to the substrate 300 without rolling in the opposite direction. For this, a method of adjusting a diameter of the cylindrical roller 100 may be used. Alternatively, intervals of the columns that include each of the plurality of first wafers 200-1, the plurality of third wafers 200-3, the plurality of fifth wafers 200-5, the plurality of second wafers 200-2, the plurality of fourth wafers 200-4, and the plurality of sixth wafers 200-6 may be adjusted.

For example, the roller 100 may pick up chips located on a first column of the plurality of first wafers 200-1 at a first location on a surface of the roller 100, and consecutively pick up chips located on another column and roll. When picking up chips located on a first column of the plurality of third wafers 200-3, a diameter of the roller 100 may be adjusted to locate the picked-up chips on the first location of the surface of the roller 100. In other words, when the first location of the surface of the roller 100 touches chips located on the first column of the plurality of first wafers 200-1 and the roller 100 rolls, the first location of the surface of the roller 100 may touch the chips located on the first column of the plurality of third wafers 200-3. However, the disclosure is not limited thereto. In particular, in addition to touching the first location of the surface of the roller 100, touching an adjacent location may be possible. Additionally, depending on the diameter of the roller 100, it is possible for the roller 10 to rotate multiple times.

In addition, as described above, it is also possible to adjust the intervals of the columns consisting of the respective plurality of wafers based on the diameter of the roller 100. Here, at least a portion of the plurality of wafers should not overlap other wafers.

According to the above-described method, the roller 100 may transport chips to the substrate 300 by picking up chips pertaining to R, G, and B all together at once, and the process time may thus be reduced.

Figure 11:
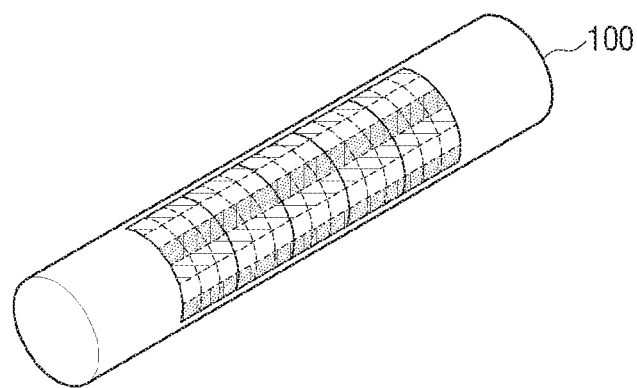
FIG. 11 is a view illustrating how a plurality of types of chips are picked up according to an exemplary embodiment.

FIG. 11 is a view illustrating how a plurality of types of chips are picked up according to an exemplary embodiment.

As illustrated in FIG. 11, the roller 100 may pick up a plurality of chips disposed on columns that are spaced apart by a first interval. The roller 100 may, for example, pick up chips from a first column, skip a second column and a third column, and pick up from a fourth column of wafers of a first type.

After repeating the process, as illustrated in FIGS. 8-10, a different type of wafer may be picked up by the same method. Accordingly, the roller 100 may consecutively pick up three types of chips.

Although FIG. 11 illustrates chips as being picked up from the three types of wafers, the disclosure is not limited thereto. Additionally, it is illustrated that with regard to an identical column, all chips are picked up but as described with reference to FIG. 4, even within the same column, chips may be picked up at second intervals.

Figure 12:
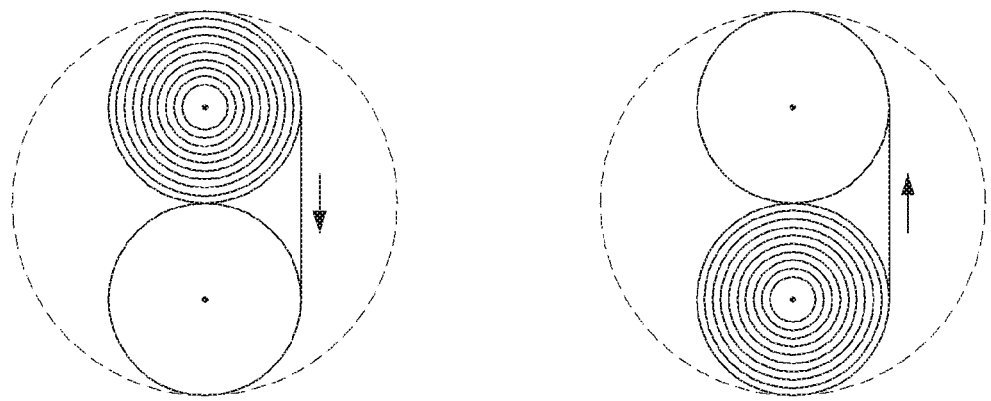
FIG. 12 is a view illustrating a roller according to another exemplary embodiment.

FIG. 12 is a view illustrating the roller 100 according to an exemplary embodiment.

Hereinabove, the roller 100 was described as having a cylindrical shape;

however, the roller 100 as illustrated in FIG. 12 may be used.

The roller 100 may include a first axis and a second axis, each of the axes (i.e., spindles) may be wrapped with a sheet and the sheet of the axes may be connected. The sheet of each axis may roll in the same direction by two axes and the sheet which was unrolled from one axis may be rolled onto the other axis as the two axes rotate in the same direction. While rolling, the roller 100 may pick up chips included in a wafer.

The roller 100 may move the picked-up chips to the substrate 300 while rolling in a direction opposite to the direction of movement when the roller 100 is picking up the chips from the wafer. Herein, the roller 100 may roll in a direction opposite to the rolling direction of the roller in the cylinder shape.

When using the roller 100 illustrated in FIG. 12, more chips may be picked up than when the cylindrical roller 100 is used. Accordingly, as illustrated in FIGS. 8-10, a method for picking up chips at once from a plurality of wafers may be used.

Figure 13:
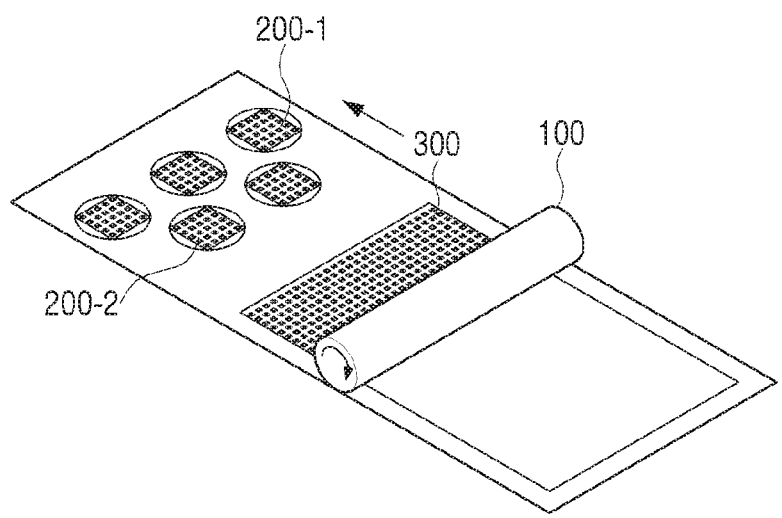
FIG. 13 is a view illustrating a table according to an exemplary embodiment.

FIG. 13 is a view illustrating a table according to an exemplary embodiment.

As described above, the roller 100, wafers 200-1, 200-2, and substrate 300 may be located on the same surface. For example, the roller 100, wafers 200-1, 200-2, and the substrate 300 may be located on a table.

Although according to the above descriptions the roller 100 picks up chips or transports chips by rolling on the substrate 300, it is also possible to provide a structure that moves a table. In this case, the table may move in an opposite direction of the rolling direction of the roller 100. In addition, the roller 100 and the table may simultaneously move; however, in this case, processing directions of the roller 100 and the table may be opposite. The rolling speed of the roller 100 and the moving speed of the table may be the same.

Figure 14:
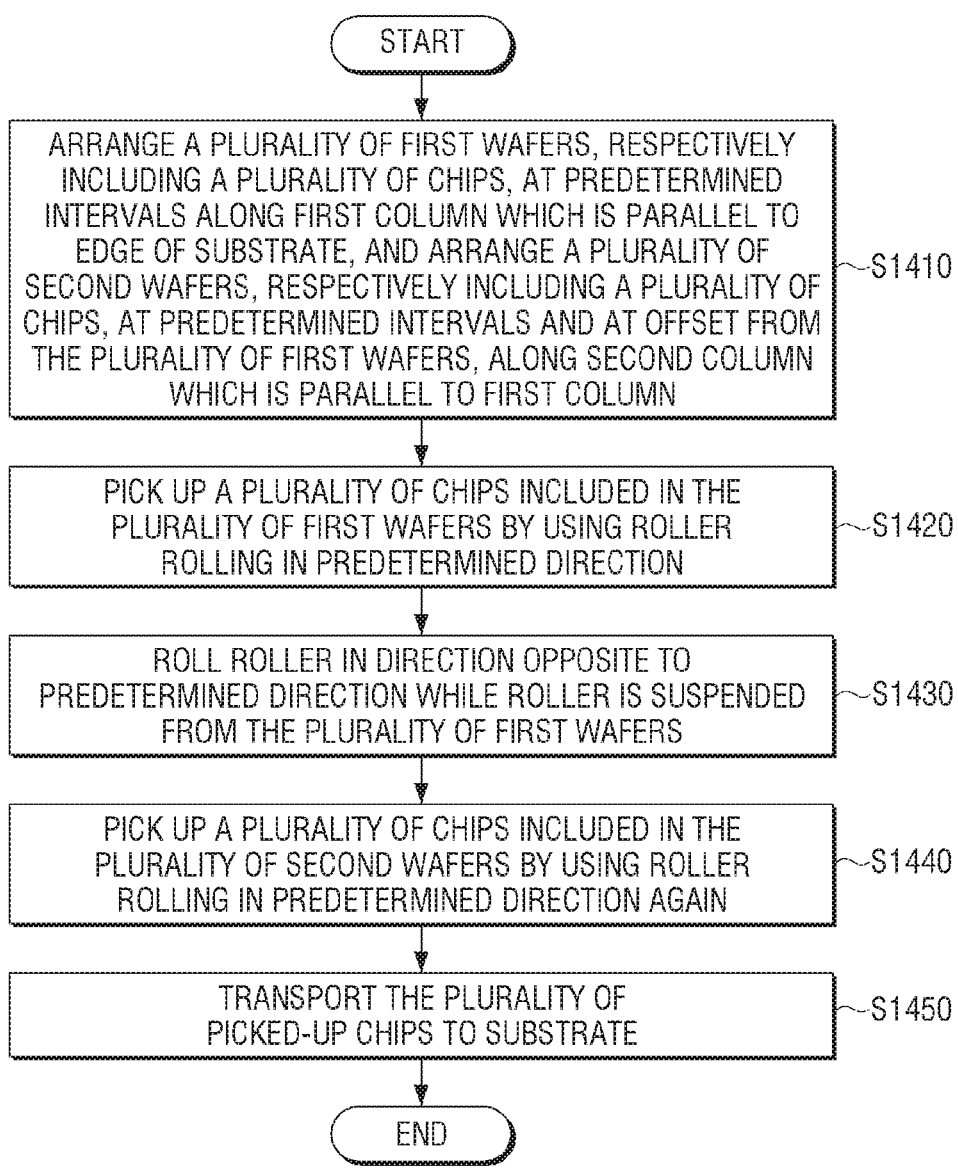
FIG. 14 is a flowchart for an operation method of a process system according to an exemplary embodiment.

FIG. 14 is a flowchart for an operation method of a process system according to an exemplary embodiment.

A plurality of first wafers, respectively including a plurality of chips, are arranged at predetermined intervals along a first column that is in parallel to an edge of a substrate, and a plurality of second wafers, respectively including a plurality of chips, are arranged at the predetermined intervals and at an offset from the plurality of first wafers, along a second column that is in parallel to the first column (S1410). Also, by using a roller that rolls in a predetermined direction, a plurality of chips included in the plurality of first wafers are picked up (S1420). The roller rolls in a direction opposite to the predetermined direction while the roller is suspended from the plurality of first wafers (S1430). By using the roller rolling again in the predetermined direction, a plurality of chips included in the plurality of second wafers are picked up (S1440). The plurality of picked-up chips are transported to the substrate (S1450).

Herein, the roller has a cylinder shape that has a predetermined length along a direction of a pivot (i.e., axis of rotation); and in the picking up of the plurality of chips included in the plurality of first wafers (S1420) and the picking up of the plurality of chips included in the plurality of second wafers (S1440), the roller rolling in the direction in which the substrate is disposed, the roller may simultaneously pick up a plurality of chips that touch the roller among the plurality of chips included in the plurality of first wafers and the plurality of second wafers which are arranged on columns along the direction of the pivot.

Each of the plurality of first wafers and the plurality of second wafers includes a plurality of chips arranged in an m×n matrix; and when picking up the plurality of chips included in the plurality of first wafers (S1420) and the plurality of chips included in the plurality of second wafers (S1440), a plurality of chips disposed in a column that is spaced apart by a first interval in the rolling direction may be simultaneously picked up by using the roller which rolls in the direction in which the substrate is disposed.

When picking up the plurality of chips included in the plurality of first wafers (S1420) and picking up the plurality of chips included in the second wafers (S1440), by using the roller rolling in the direction in which the substrate is disposed, after simultaneously picking up chips that are spaced apart at second intervals among a plurality of chips disposed on an identical column, the roller may simultaneously pick up chips that are spaced apart at the second intervals among a plurality of chips disposed on a column that is spaced apart at the first interval in the rolling direction.

The disclosure may further include arranging a plurality of third wafers, respectively including a plurality of chips, at the predetermined intervals along a third column that is parallel to the first column; arranging a plurality of fourth wafers, respectively including a plurality of chips, at the predetermined intervals and at an offset from the plurality of third wafers, along a fourth column that is parallel to the first column; and picking up some chips among a plurality of chips included in the plurality of third wafers and the plurality of fourth wafers and placing those chips between the plurality of chips picked up at the first and second intervals.

Herein, the plurality of chips included in the plurality of first wafers and the plurality of second wafers may be one of R, G, and B, and the plurality of chips included in the plurality of third wafers and the plurality of fourth wafers may be another one among R, G, and B.

The exemplary embodiment may further include: after picking up the plurality of chips from the plurality of first wafers and the plurality of second wafers, when a different type of wafers are located on the place where the plurality of first wafers and the plurality of second wafers were, moving the roller as much as the predetermined distance along an axis; and picking up a plurality of chips from a different type of wafers in the same method.

Meanwhile, while the roller rolls in the direction opposite to the predetermined direction (S1430), in order for a plurality of chips included in the plurality of second wafers to be picked up at spaces between the plurality of chips picked up from the plurality of first wafers, the roller may roll in the direction opposite to the predetermined direction by being suspended from the plurality of first wafers.

The substrate may be located in the roller's rolling direction and the plurality of first wafers and the plurality of second wafers may be consecutively located between the roller and the substrate.

The predetermined intervals may be determined based on a size of an area that includes a plurality of chips included in one wafer.

According to the various exemplary embodiments, because a plurality of chips from a plurality of wafers may be picked up and be transported to a substrate, the manufacturing time may be reduced.

Meanwhile, the methods according to the various exemplary embodiments may be stored in various storage media by being programmed. Therefore, the methods according to the various exemplary embodiments may be embodied in various kinds of electronic devices that execute a storage medium.

According to an exemplary embodiment, a non-transitory computer-readable medium storing a program by which the controlling methods are consecutively executed may be provided.

The non-transitory computer-readable medium excludes mediums that store data for a short time such as a register, cache, and a random access memory (RAM), but includes mediums that can store data permanently or semi-permanently and can be read by an apparatus. Specifically, the above-described various applications or programs may be stored in the non-transitory computer-readable medium such as a compact disc (CD), a digital versatile disc (DVD), a hard disk, a Blu-ray disc, a Universal Serious Bus (USB)

memory, a memory card, a read-only memory (ROM), and the like, and the various application or programs can be provided.

Hereinabove, the explanations and the drawings are based on exemplary embodiments but the disclosure is not limited to the above-described exemplary embodiments. When the exemplary embodiments have been illustrated and described, it will be understood by those skilled in the art that various changes in form and details may be made therein without departing from the spirit and scope of the exemplary embodiments as defined by the appended claims.

The word "exemplary" is used herein to mean "serving as an example or illustration." Any aspect or design described herein as "exemplary" is not necessarily to be construed as preferred or advantageous over other aspects or designs.

What is claimed is:

1. A process system comprising:
    a surface on which a plurality of first chips are disposed;
    a roller configured to roll in a first rotational direction to pick up the plurality of first chips on the surface,
    a target substrate arranged on the surface; and
    a plurality of first substrates and a plurality of second substrates,
    wherein when the roller picks up the plurality of first chips on the surface, a height of the roller from the surface is changed by moving the roller upwards or downwards based on whether at least one chip of the plurality of first chips is disposed under the roller,
    wherein the height of the roller from the surface is greater when the at least one chip of the plurality of first chips is disposed under the roller than when the roller is in contact with the surface,
    wherein the plurality of first substrates are arranged at predetermined intervals along a first column which is parallel to an edge of the target substrate, each of the plurality of first substrates including the plurality of first chips,
    wherein the plurality of second substrates are arranged at the predetermined intervals and at an offset from the plurality of first substrates, along a second column which is parallel to the first column, each of the plurality of second substrates including a plurality of second chips, and
    wherein the roller is further configured to:
        roll in the first rotational direction to pick up the plurality of first chips included in the plurality of first substrates,
        pick up the plurality of second chips included in the plurality of second substrates by rolling in the first rotational direction such that a group of the plurality of second chips picked up from a second substrate, from among the plurality of second substrates, is positioned on the roller between two groups of the plurality of first chips picked up from the plurality of first substrates, and
        transport the plurality of first chips and the plurality of second chips to the target substrate.

2. The process system as claimed in claim 1, wherein the height of the roller decreases based on the at least one chip of the plurality of first chips is under the roller, and the height of the roller increases based on the at least one chip of the plurality of first chips is not under the roller.

3. The process system as claimed in claim 1, wherein the roller has a cylinder shape and a predetermined length along a pivot direction that is perpendicular to the first rotational direction, and wherein the roller is further configured to, while rolling in the first rotational direction, simultaneously pick up a first group of chips that are arranged in the pivot direction, the first group of chips being arranged in the pivot direction and selected from one of the plurality of first chips included in the plurality of first substrates and the plurality of second chips included in the plurality of second substrates.

4. The process system as claimed in claim 1, wherein the plurality of first chips and the plurality of second chips are arranged in an m×n matrix,
    wherein the roller is further configured to, while rolling in the first rotational direction and moving in a first lateral direction towards the target substrate, simultaneously pick up a first group of chips, among the plurality of first chips and the plurality of second chips, and simultaneously pick up a second group of chips, among the plurality of first chips and the plurality of second chips,
    wherein the first group of chips are arranged along a pivot direction of the roller, the pivot direction being perpendicular to the first rotational direction,
    wherein the second group of chips are arranged along the pivot direction of the roller, and
    wherein the first group of chips are spaced apart from the second group of chips by a first interval in the first lateral direction.

5. The process system as claimed in claim 4, wherein the first group of chips are spaced apart from each other at second intervals along the pivot direction of the roller, and the second group of chips are spaced apart from each other at the second intervals along the pivot direction of the roller.

6. The process system as claimed in claim 5, further comprising:
    a plurality of third substrates arranged at the predetermined intervals along a third column which is parallel to the first column, the plurality of third substrates including a plurality of third chips; and
    a plurality of fourth substrates arranged at the predetermined intervals and at an offset from the plurality of third substrates, along a fourth column which is parallel to the first column, the plurality of fourth substrates including a plurality of fourth chips,
    wherein the roller is further configured to pick up at least some chips from the plurality of third substrates and the plurality of fourth substrates in between some of the plurality of first chips and the plurality of second chips that are picked up from the plurality of first substrates and the plurality of second substrates.

7. The process system as claimed in claim 6, wherein the plurality of first chips included in the plurality of first substrates and the plurality of second chips included in the plurality of second substrates are one of a red (R) type, a green (G) type, and a blue (B) type, and the plurality of third chips included in the plurality of third substrates and the plurality of fourth chips included in the plurality of fourth substrates are another one of the R type, the G type, and the B type.

8. The process system as claimed in claim 5, wherein the plurality of first chips included in the plurality of first substrates and the plurality of second chips included in the plurality of second substrates include first chips of a first type and second chips of a second type, and the roller is further configured to pick up the first chips of the first type, move a predetermined distance in a second lateral direction opposite of the first lateral direction, and pick up the second chips of the second type.

9. The process system as claimed in claim 1, wherein the roller is further configured to, in order for the plurality of second chips included in the plurality of second substrates to be picked up at spaces between the plurality of first chips picked up from the plurality of first substrates, roll in a second rotational direction while the roller is suspended from the plurality of first substrates.

10. The process system as claimed in claim 1, wherein the roller moves towards the target substrate while rolling in the first rotational direction, and wherein the plurality of first substrates and the plurality of second substrates are consecutively located between an initial position of the roller and the target substrate.

11. The process system as claimed in claim 1, wherein the predetermined intervals are determined based on a size of an area occupied by a number of chips included in a single substrate of at least one of the plurality of first substrates and the plurality of second substrates.

* * * * *